(12) United States Patent
Kim et al.

(10) Patent No.: US 8,501,512 B2
(45) Date of Patent: Aug. 6, 2013

(54) THIN FILM TRANSISTOR ARRAY PANEL AND METHOD FOR MANUFACTURING THE SAME

(75) Inventors: Jae-Sung Kim, Suwon-si (KR); Hoon Kang, Suwon-si (KR); Yang-Ho Jung, Yongin-si (KR)

(73) Assignee: Samsung Display Co., Ltd. (KR)

( * ) Notice: Subject to any disclaimer, the term of this patent is extended or adjusted under 35 U.S.C. 154(b) by 432 days.

(21) Appl. No.: 12/910,268

(22) Filed: Oct. 22, 2010

(65) Prior Publication Data
US 2011/0254815 A1  Oct. 20, 2011

(30) Foreign Application Priority Data
Apr. 19, 2010  (KR) .................. 10-2010-0035750

(51) Int. Cl.
*H01L 33/08* (2010.01)
(52) U.S. Cl.
USPC .................... 438/34; 257/E33.053
(58) Field of Classification Search
None
See application file for complete search history.

(56) References Cited

U.S. PATENT DOCUMENTS

| | | |
|---|---|---|
| 6,359,672 B2 | 3/2002 | Gu et al. |
| 2007/0279544 A1* | 12/2007 | Bae et al. .................. 349/43 |

FOREIGN PATENT DOCUMENTS

| | | |
|---|---|---|
| JP | 2003195355 A | 7/2003 |
| JP | 2004294805 A | 10/2004 |
| KR | 100443840 B | 7/2004 |
| KR | 1020050102442 A | 10/2005 |
| KR | 1020060011160 A | 2/2006 |
| KR | 1020070098718 A | 10/2007 |
| KR | 1020080026758 A | 3/2008 |
| KR | 1020080098238 A | 11/2008 |

* cited by examiner

*Primary Examiner* — Seahvosh Nikmanesh
(74) *Attorney, Agent, or Firm* — Cantor Colburn LLP (57) ABSTRACT

A manufacturing method of a thin film transistor array panel includes forming a gate line, forming a gate insulating layer on the gate line, forming a data line including a drain electrode on the gate insulating layer, forming a passivation layer on the gate insulating layer, the data line, and the drain electrode, forming a negative photosensitive organic layer on the passivation layer, heat treating the negative photosensitive organic layer to form an insulating layer including a first portion, and a second portion that is thinner than the first portion, and forming a pixel electrode, a first contact assistant, and a second contact assistant on the insulating layer. The pixel electrode is disposed on the first portion, the first and second contact assistants are disposed on the second portion, and the thickness of the second portion is less than about 1.5 micrometers (μm).

12 Claims, 8 Drawing Sheets

THIN FILM TRANSISTOR ARRAY PANEL AND METHOD FOR MANUFACTURING THE SAME

This application claims priority to Korean Patent Application No. 10-2010-0035750 filed on Apr. 19, 2010, and all the benefits accruing therefrom under 35 U.S.C. 119, the entire contents of which are incorporated herein by reference.

BACKGROUND OF THE INVENTION (a) Field of the Invention

The invention relates to a thin film transistor array panel and a manufacturing method thereof.

(b) Description of the Related Art

A liquid crystal display ("LCD") is one of the most commonly used flat panel displays. The LCD includes two substrates with electrodes formed thereon, and a liquid crystal layer interposed between the two substrates. In the LCD, a voltage is applied to the electrodes to realign liquid crystal molecules of the liquid crystal layer, to thereby regulate the transmittance of light passing through the liquid crystal layer.

Among the liquid crystal displays, a liquid crystal display having a structure in which field generating electrodes are respectively formed on two display panels, and including a thin film transistor switching a voltage applied to the electrodes and formed in one of the two display panels, is widely used.

To improve the display characteristics of the liquid crystal display, the aperture ratio of the pixel must be ensured. To ensure the aperture ratio, a pixel electrode is maximized to be overlapped with a gate line and a data line, and an insulating layer including an organic material having a low dielectric ratio is thickly formed with a thickness of about 3 micrometers ($\mu$m), to minimize interference of signals transmitted through the wiring.

However, when applying the thick organic layer, a step of the organic layer is seriously generated in a contact portion of the signal line for connection with an output of an external driving circuit. When electrically connecting a driver integrated circuit ("IC") and the signal line by using an anisotropically conductive layer including conductive particles in the contact portion, contact deterioration is generated due to the step such that the contact reliability may be deteriorated.

BRIEF SUMMARY OF THE INVENTION

The invention ensures contact reliability between a signal line and a driver IC.

An exemplary embodiment of a manufacturing method of a thin film transistor array panel includes forming a gate electrode, a gate pad, and a gate line on a substrate, forming a gate insulating layer on the gate line, forming a data line including a source electrode, a data pad, and a drain electrode facing the source electrode on the gate insulating layer, forming a passivation layer on the gate insulating layer, the data line, and the drain electrode, forming a negative photosensitive organic layer on the passivation layer, forming a protrusion and depression pattern and a plurality of openings in the negative photosensitive organic layer by using a photomask exposed to light, heat treating the negative photosensitive organic layer to form an insulating layer including a first portion, and a second portion that is thinner than the first portion, etching the passivation layer and the gate insulating layer by using the insulating layer as a mask to form a first contact hole exposing the drain electrode, a second contact hole exposing the gate pad, and a third contact hole exposing the data pad, and forming a pixel electrode, a first contact assistant, and a second contact assistant on the insulating layer. The pixel electrode is disposed on the first portion, the first and second contact assistants are disposed on the second portion, and the thickness of the second portion is less than 1.5 micrometers ($\mu$m).

The second portion of the insulating layer may be formed by heat treating the protrusion and depression pattern of the negative photosensitive organic layer.

The photomask may include a light blocking portion blocking the light, and a transmission portion through which the light is transmitted. The light blocking portion may be disposed on a portion corresponding to the first contact hole, the second contact hole, the third contact hole, the first contact assistants, and the second contact assistants.

The light blocking portion of the photomask may include a first portion overlapping the first contact assistants and the second contact assistants. The first portion of the light blocking portion includes a narrow interval where no light blocking material is disposed between adjacent portions of the light blocking material.

The heat treatment may be executed at a temperature of about 220 degrees Celsius to about 230 degrees Celsius, for about 30 minutes to about 1 hour.

A thickness of the protrusion and depression pattern in the negative photosensitive organic layer may be less than about 0.2 $\mu$m.

The substrate may include a display area and a peripheral area, and a gate driving circuit and a data driving circuit in the peripheral area may be further included.

There may be nine hundred sixty (960) channels in the data driving circuit.

An exemplary embodiment of a thin film transistor array panel includes a substrate, a gate line disposed on the substrate and including a gate electrode, a gate insulating layer disposed on the gate line, a data line including a source electrode, and a drain electrode facing the source electrode and disposed on the gate insulating layer, a passivation layer disposed on the gate insulating layer, the data line, and the drain electrode, an insulating layer including an organic material having negative photosensitivity disposed on the passivation layer and including a first portion, and a second portion that is thinner than the first portion, and a pixel electrode, a first contact assistant, and a second contact assistant disposed on the insulating layer. The pixel electrode is disposed on the first portion, the first and second contact assistants are disposed on the second portion, and the thickness of the second portion is less than 1.5 $\mu$m.

According to an exemplary embodiment of the invention, the thickness of the insulating layer of the contact portion where the gate line and the data line are each connected to an external driving circuit is decreased, such that the step of the contact portion may be minimized, thereby improving the contact reliability between the gate line, the data line and the external driving circuit, respectively.

BRIEF DESCRIPTION OF THE DRAWINGS

The above and other features of this disclosure will become more apparent by describing in further detail exemplary embodiments thereof with reference to the accompanying drawings, in which.

DETAILED DESCRIPTION OF THE INVENTION

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. As used herein, the term "and/or" includes any and all combinations of one or more of the associated listed items. As used herein, "connected" may refer to physically and/or electrically connected.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower", "under," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" or "lower" relative to other elements or features would then be oriented "upper" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

Figure 1:
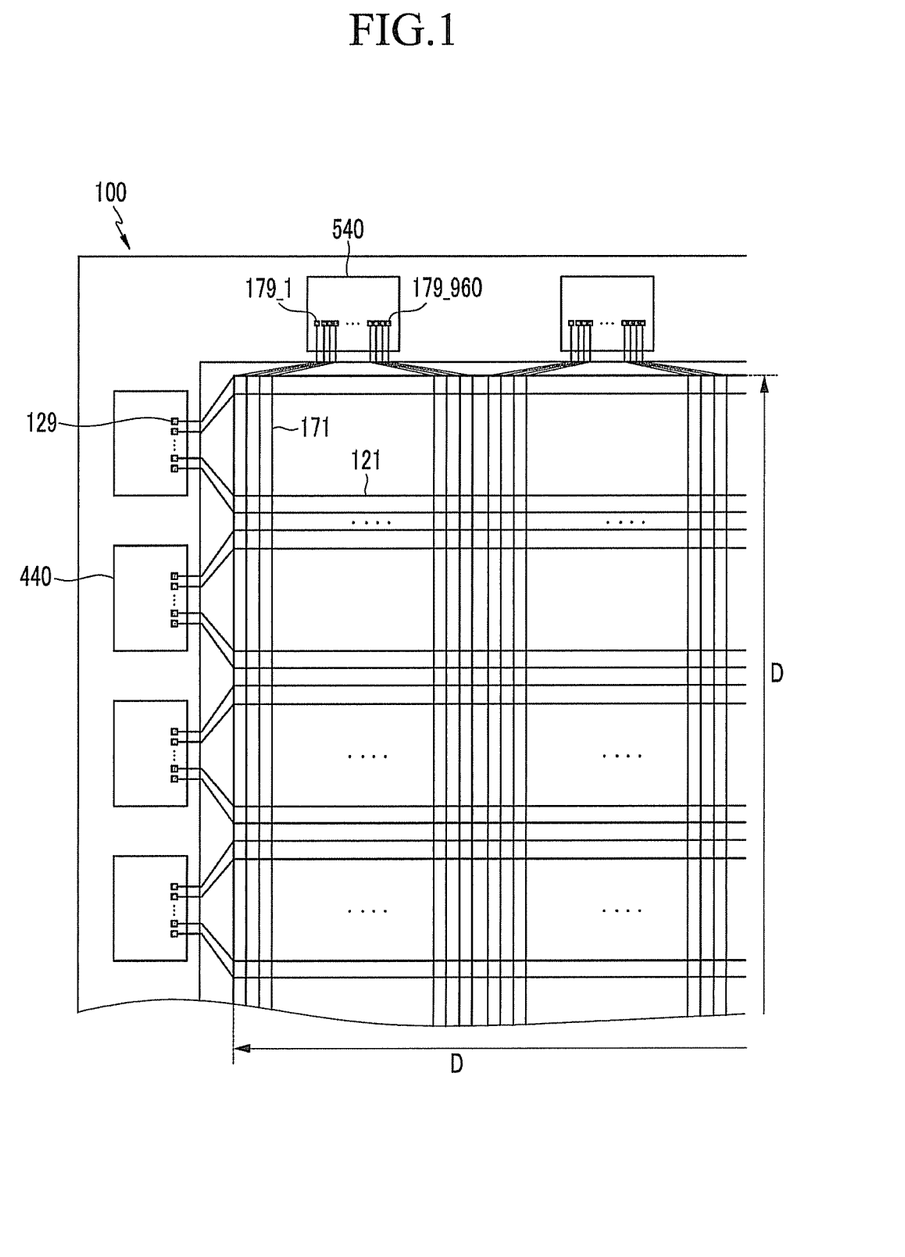
FIG. 1 is a plan view of an exemplary embodiment of a thin film transistor array panel, according to the invention.

FIG. 1 is a plan view of an exemplary embodiment of a thin film transistor array panel, according to the invention.

As shown in FIG. 1, a thin film transistor array panel 100 according to the illustrated embodiment of the invention includes a plurality of a gate line 121 extending in a transverse direction, and a plurality of a data line 171 extending in a longitudinal direction. The thin film transistor array panel 100 is divided into a display area D including a plurality of a pixel area displaying images, and a region outside and excluding the display area D, which is a peripheral area. The pixel area is an independent area unit capable of independently controlling the liquid crystal. In one exemplary embodiment, the pixel area may be defined by the intersection of the gate line 121 and the data line 171.

A plurality of a data driving integrated circuit ("IC") 540 applying data signals to the data lines 171 by selecting a gray voltage and connected to data pads connected to the data lines 171, are sequentially arranged in the transverse direction in an upper side and outside of the display area D of the thin film transistor array panel 100, in the plan view. In the illustrated embodiment, one data driving IC 540 includes nine hundred sixty (960) channels. The one data driving IC 540 is connected to a plurality of a data pad 179, such as nine hundred sixty (960) data pads 179_1 to 179_960. That is, the channels of the one data driving IC 540 are in a one-to-one correspondence with the data pads 179.

Connection lines (not shown) are disposed between adjacent data driving ICs 540, carry signal supplied from external to the thin film transistor array panel 100, and sequentially transmit the signal to the data driving ICs 540 arranged in the transverse direction.

In the plan view of FIG. 1, at the left side of the thin film transistor array panel 100, a plurality of a gate driving IC 440 connected to a plurality of a gate pad 129, which are connected to the gate lines 121 and applying gate signals consisting of a combination of a gate-on voltage and a gate-off voltage to the gate lines 121, are arranged in the longitudinal direction.

A plurality of a driving signal line (not shown) is disposed near and/or directly adjacent to the gate driving ICs 440, thereby electrically connecting the gate driving ICs 440 to each other. In an exemplary embodiment, each gate driving IC 440 may be directly disposed on a substrate 110 (FIG. 3) along with a switching element or a driving signal line, thereby having a structure including a plurality of thin film transistors or signal lines.

Next, a liquid crystal display including the thin film transistor array panel 100 shown in FIG. 1, will be described with reference to FIG. 2 and FIG. 3.

Figure 2:
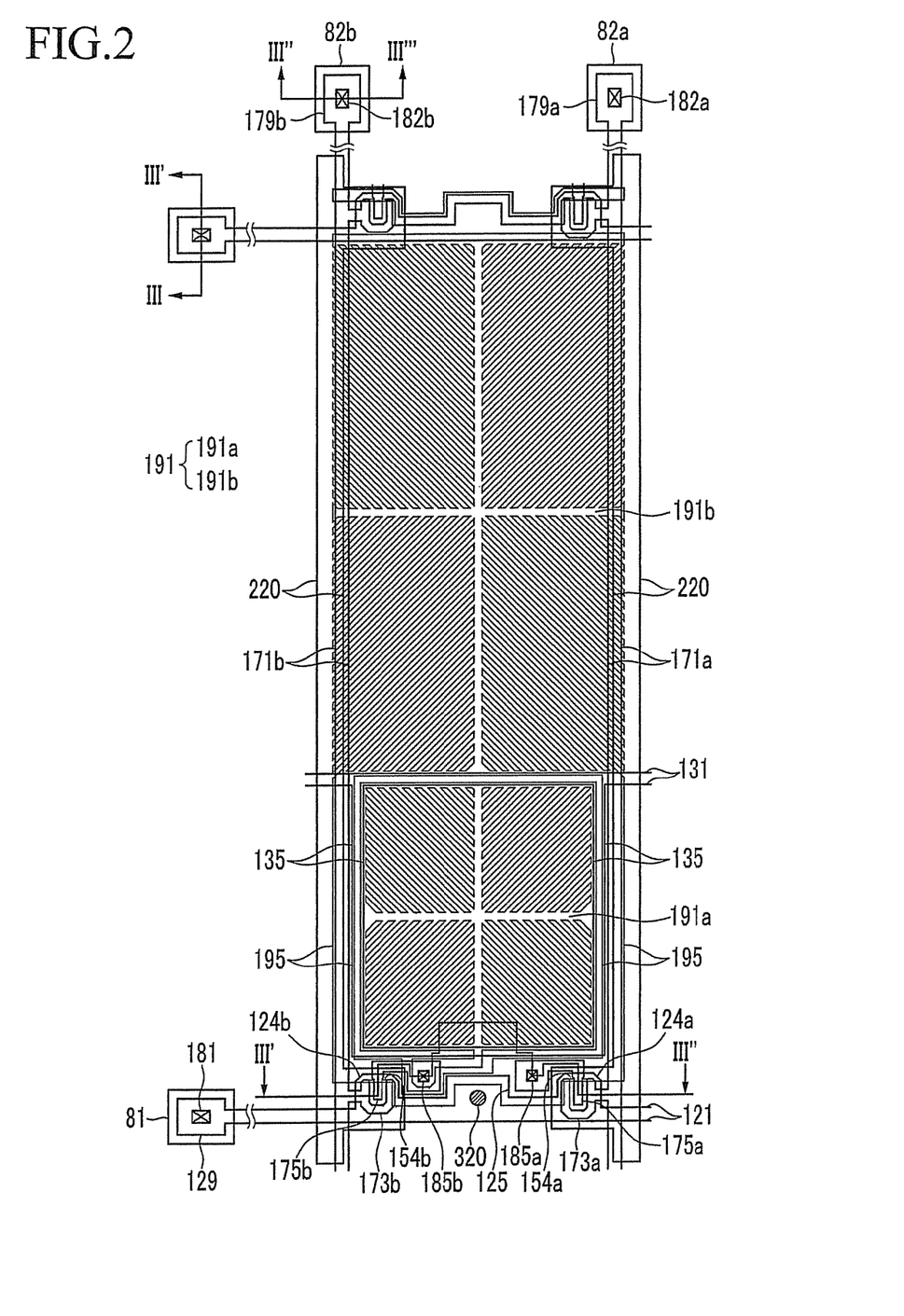
FIG. 2 is a plan view of an exemplary embodiment of a liquid crystal display, according to the invention.
Figure 3:
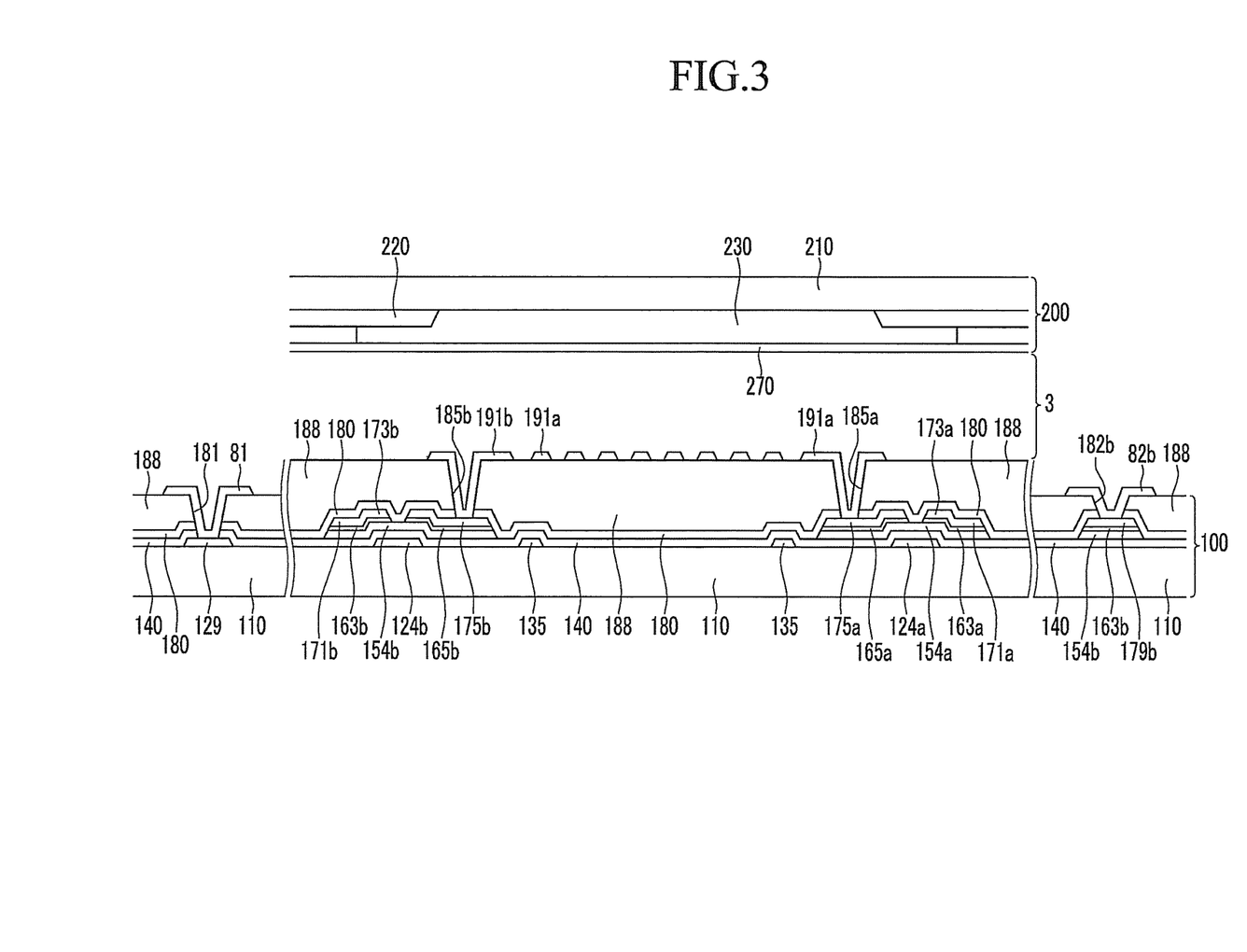
FIG. 3 is a cross-sectional view taken along lines III-III', III'-III'' and III''-III''' of FIG. 2.

FIG. 2 is a plan view of an exemplary embodiment of a liquid crystal display, according to the invention, and FIG. 3 is a cross-sectional view taken along lines III-III', III'-III" and III"-III'" of FIG. 2.

As shown in FIG. 2 and FIG. 3, a liquid crystal display according to the illustrated embodiment of the invention includes a lower panel 100 (e.g., the thin film transistor array panel), an upper panel 200 facing the lower panel 100, and a liquid crystal layer 3 interposed between the two display panels 100 and 200.

Firstly, the lower panel 100 will be described.

A plurality of the gate line 121 and a plurality of a storage electrode line 131 are disposed on an insulating substrate 110.

The gate lines 121 extend substantially in a transverse direction and transmit gate signals. Each gate line 121 includes a plurality of first and second gate electrodes 124a and 124b protruding upward (e.g., in the longitudinal direction) from a main transverse portion of the gate line 121, and a plurality of protrusions 125 protruding upward from the main transverse portion and disposed between the gate electrodes 124a and 124b which are adjacent to each other along the gate line 121, for example, within a pixel area. Also, the gate lines 121 are connected to gate pads 129, which are connected to the gate driving ICs 440.

The storage electrode lines 131 extend substantially parallel to the gate lines 121, and include a plurality of a storage electrode 135 extending therefrom. However, in alternative exemplary embodiments, the shape and disposition of the storage electrode lines 131 may be variously changed.

A gate insulating layer 140 is disposed on the gate line 121 and the storage electrode line 131. A plurality of semiconductors 154a and 154b including amorphous or crystallized silicon, are disposed on the gate insulating layer 140.

A plurality of pairs of ohmic contacts 163a and 163b, and 165a and 165b, are disposed on the semiconductors 154a and 154b. The ohmic contacts 163a, 163b, 165a, and 165b may include a material such as n+ hydrogenated amorphous silicon in which an n-type impurity such as phosphorus is doped with a high concentration, or of silicide.

A plurality of pairs of data lines 171a and 171b, and a plurality of pairs of first and second drain electrodes 175a and 175b are disposed on the ohmic contacts 163a, 163b, 165a, and 165b and on the gate insulating layer 140.

The data lines 171a and 171b transfer a data signal and are mainly extended in a longitudinal direction, thereby intersecting the gate lines 121 and the storage electrode lines 131. The data lines 171a and 171b include first and second source electrodes 173a and 173b curved with a "U" shape in the plan view, and extending toward the first and second gate electrodes 124a and 124b from the data lines 171a and 171b, respectively. The first and second source electrodes 173a and 173b respectively face the first and second drain electrodes 175a and 175b, with respect to the first and second gate electrodes 124a and 124b. Also, the data lines 171a and 171b are respectively connected to data pads 179a and 179b, which are connected to the data driving ICs 540.

The first and second drain electrodes 175a and 175b include a first end enclosed by the "U" shape of the first and second source electrodes 173a and 173b and are extended upward in the plan view. A second end of the first and second drain electrodes 175a and 175 may include a wide area for connection to another layer in the liquid crystal display. However, in alternative embodiments, the shapes and arrangements of the first and second drain electrodes 175a and 175b, and/or the data lines 171a and 171b may be modified in various forms.

The first and second gate electrodes 124a and 124b, the first and second source electrodes 173a and 173b, and the first and second drain electrodes 175a and 175b respectively form first and second thin film transistors ("TFT") along with the first and second semiconductors 154a and 154b. Channels of the first and second thin film transistors are respectively formed in the first and second semiconductors 154a and 154b, between the first and second source electrodes 173a and 173b, and the first and second drain electrodes 175a and 175b, respectively.

At the channels of the first and second thin film transistors, the semiconductors 154a and 154b include exposed portions not covered (e.g., overlapped) by the data lines 171a and 171b and the drain electrodes 175a and 175b, including a portion of the semiconductors 154a and 154b between the source electrodes 173a and 173b, and the drain electrodes 175a and 175b, respectively.

A passivation layer 180 including silicon nitride or silicon oxide, is disposed on the data lines 171a and 171b, the drain electrodes 175a and 175b, and the exposed portions of the semiconductors 154a and 154b.

An insulating layer 188 different from the passivation layer 180 and including an organic material having an excellent planarization characteristic and having negative photosensitivity, is disposed on the passivation layer 180.

The insulating layer 188 and the passivation layer 180 include a plurality of contact holes 185a and 185b extended therethrough and exposing the first and second drain electrodes 175a and 175b, and a plurality of contact holes 182a and 182b extended therethrough and exposing the data pads 179a and 179b. Also, the insulating layer 188, the passivation layer 180, and the gate insulating layer 140 including a plurality of contact holes 181 extended therethrough and exposing the gate pads 129.

A plurality of a pixel electrode 191, a first contact assistant 81, and second contact assistants 82a and 82b are disposed on the insulating layer 188. Each pixel electrode 191 includes first and second sub-pixel electrodes 191a and 191b that are separated from each other, in the plan view of the liquid crystal display.

The first contact assistants 81 are connected to the gate pads 129 through the contact holes 181, and the second contact assistants 82a and 82b are respectively connected to the data pads 179a and 179b through the contact holes 182a and 182b. The first and second contact assistants 81, 82a, and 82b enhance the adhesion between the gate pads 129 and the data pads 179a and 179b, and the gate driving ICs 440 and the data driving ICs 540, and protect the gate pads 129 and the data pads 179a and 179b.

Here, a thickness of the insulating layer 188 disposed under and overlapping the first and second contact assistants 81, 82a, and 82b is smaller than a thickness of the insulating layer 188 disposed under and overlapping the pixel electrodes 191. The thicknesses are taken perpendicular to a plane of the substrate 110.

As described above, the thickness of the insulating layer 188 around and directly adjacent to a circumference of the contact holes 181, 182a, and 182b exposing the gate pads 129 and the data pads 179a and 179b, is decreased in comparison to the thickness of the insulating layer 188 disposed under and overlapping the pixel electrodes 191, to minimize the difference of a step in a contact portion of a signal line (e.g., gate lines 121 and data lines 171 with first and second contact assistants 81, 82a, and 82b) for connection with an output of an external driving circuit. When the step in the contact portion of the signal line is minimized, a deterioration such as a lifting phenomenon may be reduced or effectively prevented when connecting the gate driving ICs 440 and the data driving ICs 540 to the signal line, such as by using the anisotropically conductive layer including conductive particles. Consequently, uniform cohesion may be maintained and contact reliability may be ensured. In one exemplary embodiment, it is preferable that the step according to the depth of the contact holes 181, 182a, and 182b is less than about 1.5 micrometer (μm).

As, shown in FIG. 2, spacers 320 maintaining an interval between the lower panel 100 and the upper panel 200, are disposed directly on the insulating layer 188 in an area of the insulating layer 188 overlapping the protrusions 125 of the gate lines 121.

Next, the upper panel 200 will be described.

The upper panel 200 includes a light blocking member 220 and a color filter 230. The light blocking member 220 is disposed on a transparent insulation substrate 210 and overlapping the gate lines 121, the data lines 171a and 171b, and the first and second thin film transistors. The color filter 230 is disposed on the light blocking member 220 and the transparent insulation substrate 210.

A common electrode 270 is disposed on a whole surface on the color filter 230. However, in an alternative embodiment the common electrode 270 may be disposed on the lower panel 100.

The liquid crystal layer 3 is disposed between the upper panel 200 and the lower panel 100.

According to the exemplary embodiment of the invention, the thickness of the insulating layer of the contact portion of signal lines what are connected to an external driving circuit is decreased, such that the step of the contact portion may be minimized, thereby improving the contact reliability between the signal line and the external driving circuit, respectively.

Next, an exemplary embodiment of a manufacturing method of the liquid crystal display shown in FIG. 2 and FIG. 3 will be described with reference to FIG. 4 to FIG. 8. FIG. 4 to FIG. 8 are views sequentially showing the exemplary embodiment of the manufacturing method of the liquid crystal display, according to the invention.

Figure 4:
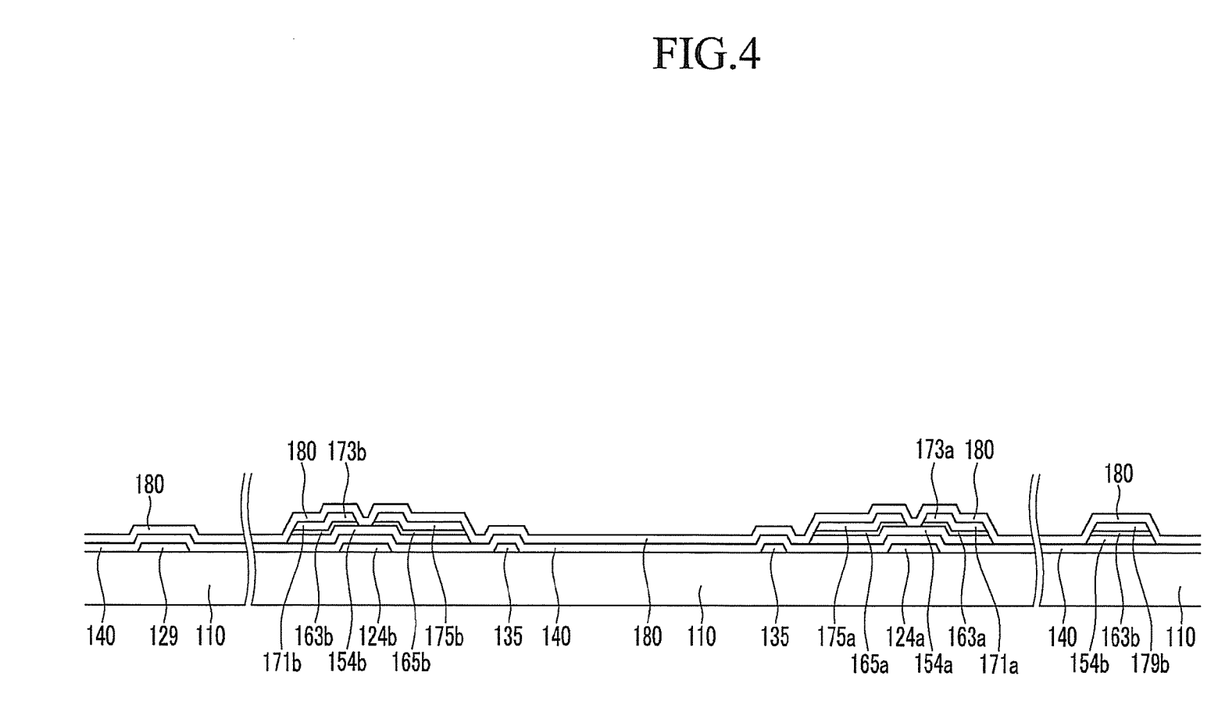
FIG. 4 to FIG. 8 are views sequentially showing an exemplary embodiment of a manufacturing method of a liquid crystal display, according to the invention.

As shown in FIG. 4, a gate line 121 including gate electrodes 124a and 124b, a gate pad 129, a storage electrode line 131 including a storage electrode 135, a gate insulating layer 140, semiconductors 154a and 154b, ohmic contacts 163a, 163b, 165a, and 165b, data lines 171a and 171b including source electrodes 173a and 173b, data pad 179a and 179b, and drain electrode 175a and 175b are sequentially formed on an insulation substrate 110, and then a passivation layer 180 is formed on a whole surface of the insulation substrate 110 including the abovementioned elements.

Figure 5:
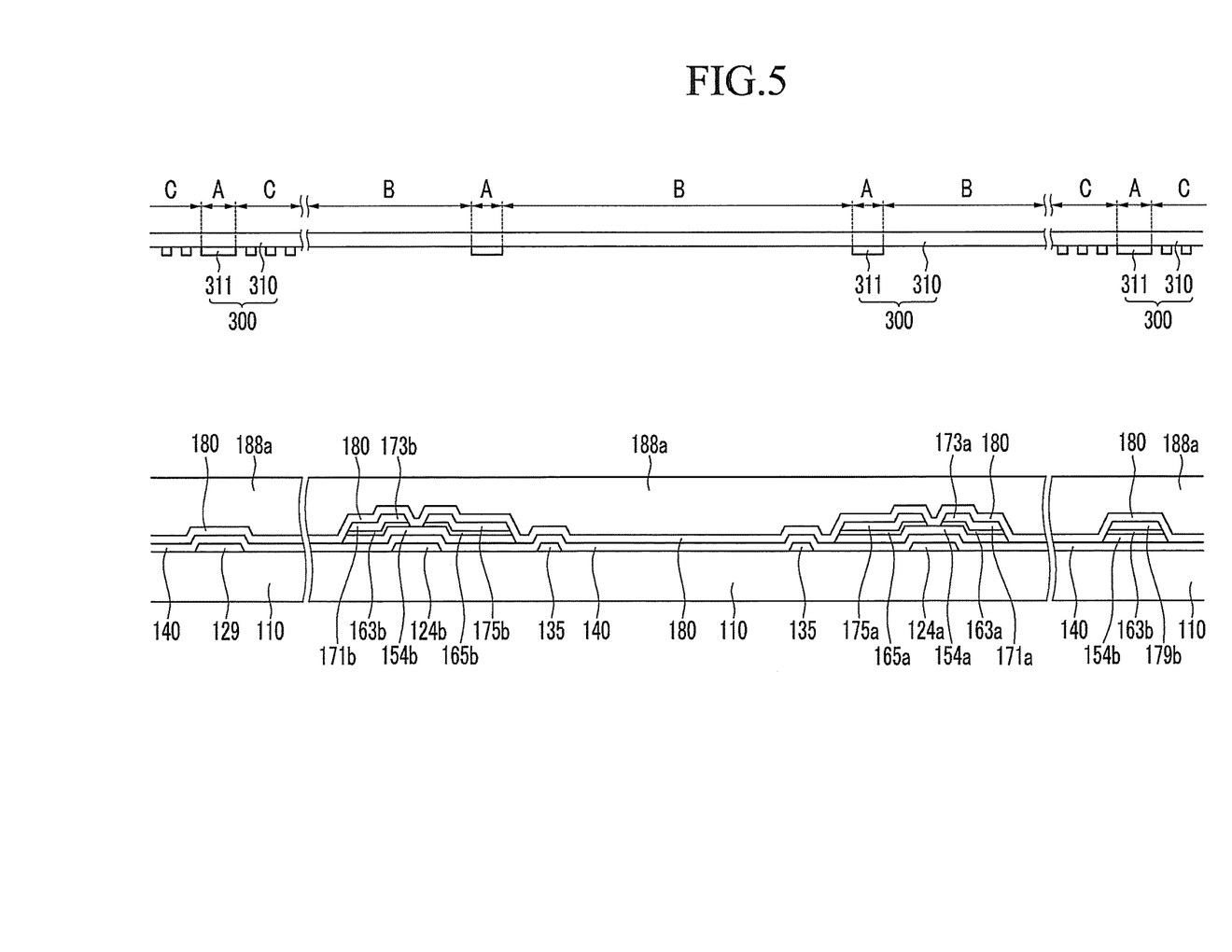

As shown in FIG. 5, an organic layer 188a including an organic material having negative photosensitivity, is coated on the passivation layer 180, and is exposed (e.g., with light) by using a mask 300. The mask 300 includes a transparent substrate 310 and a plurality of a light blocking layer 311. The light blocking layer 311 completely blocks the light used for the exposure at region A corresponding to the contact holes 181, 182a, 182b, 185a, and 185b. As used herein, "corresponding" indicates aligned or the same in number, dimension and/or positional placement relative to another element.

The light blocking layer 311 is a single continuous member at the region A. The mask 300 is formed with a narrow interval, where no light blocking material of the mask is disposed, between the plurality of light blocking layers 311 at the region C corresponding to the portion where the first and second contact assistants 81, 82a, and 82b are formed. The light blocking layer 311 is not disposed at the remaining portion B of the mask 300.

Figure 6:
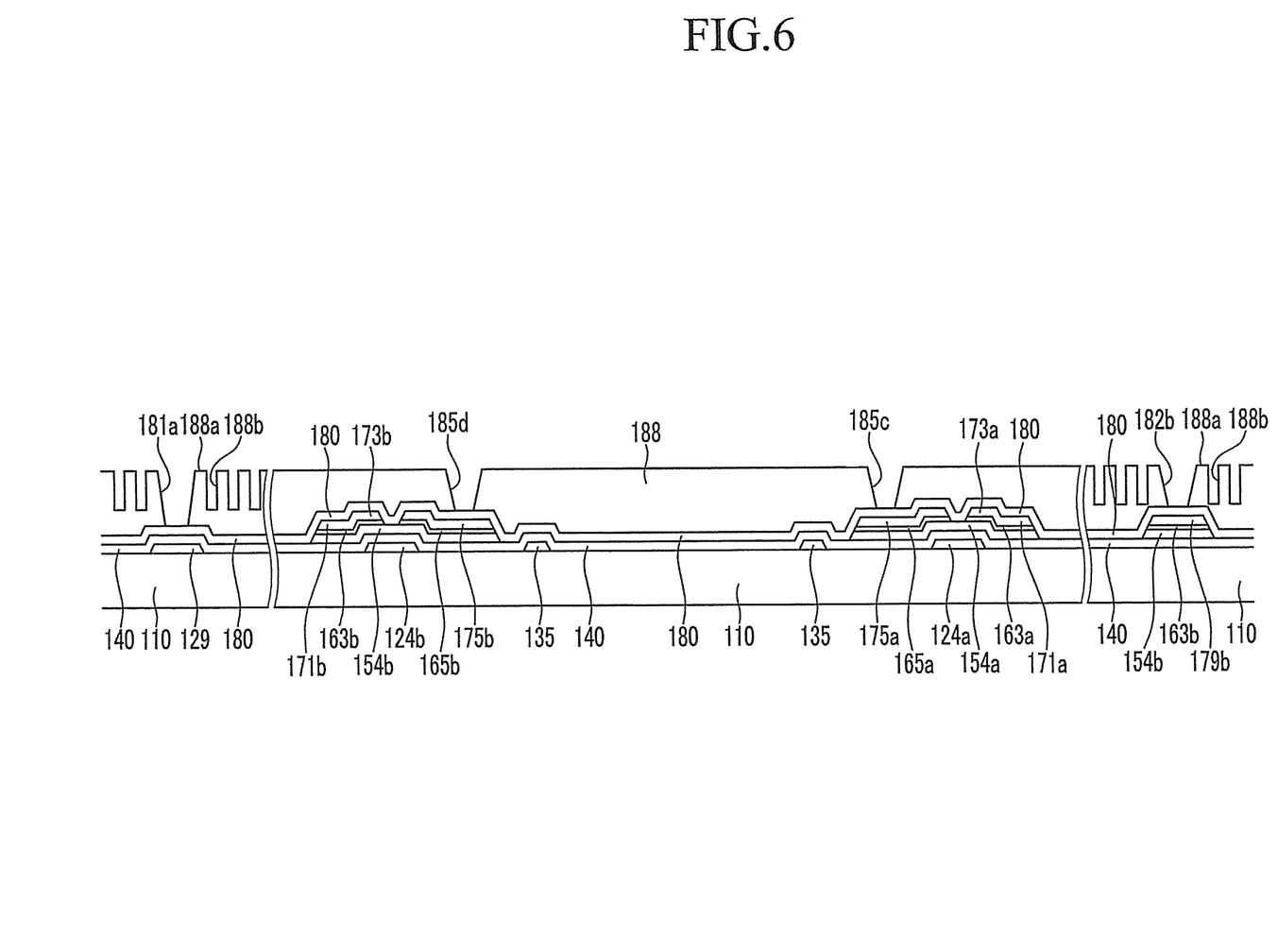

As shown in FIG. 6, a portion of the organic layer 188a which overlapped with portions of the mask 300 not including the light blocking layer 311 is developed to form openings 181a, 182b, 185c, and 185d in the organic layer 188a. The opening is an enclosed opening penetrating an entire thickness of the organic layer 188a, such that the organic layer 188a solely defines the enclosed openings 181a, 182b, 185c, and 185d.

The openings 181a, 182b, 185c, and 185d are respectively formed corresponding to the portions where the gate pad 129 and the first contact assistant 81 are physically and electrically connected to each other, where the data pad 179b and the second contact assistant 82b are physically and electrically connected to each other, and where the pixel electrodes 191a and 192b and the drain electrodes 175a and 175b are respectively physically and electrically connected to each other.

A protrusion and depression pattern including a plurality of a recess portion 188b is formed in the organic layer 188a overlapping the gate pads 129 and the data pads 179b. In one exemplary embodiment, it is preferable that a thickness of the protrusion and depression pattern, from a distal end of the protrusion to a bottom of the depression is less than about 0.2 μm.

Figure 7:
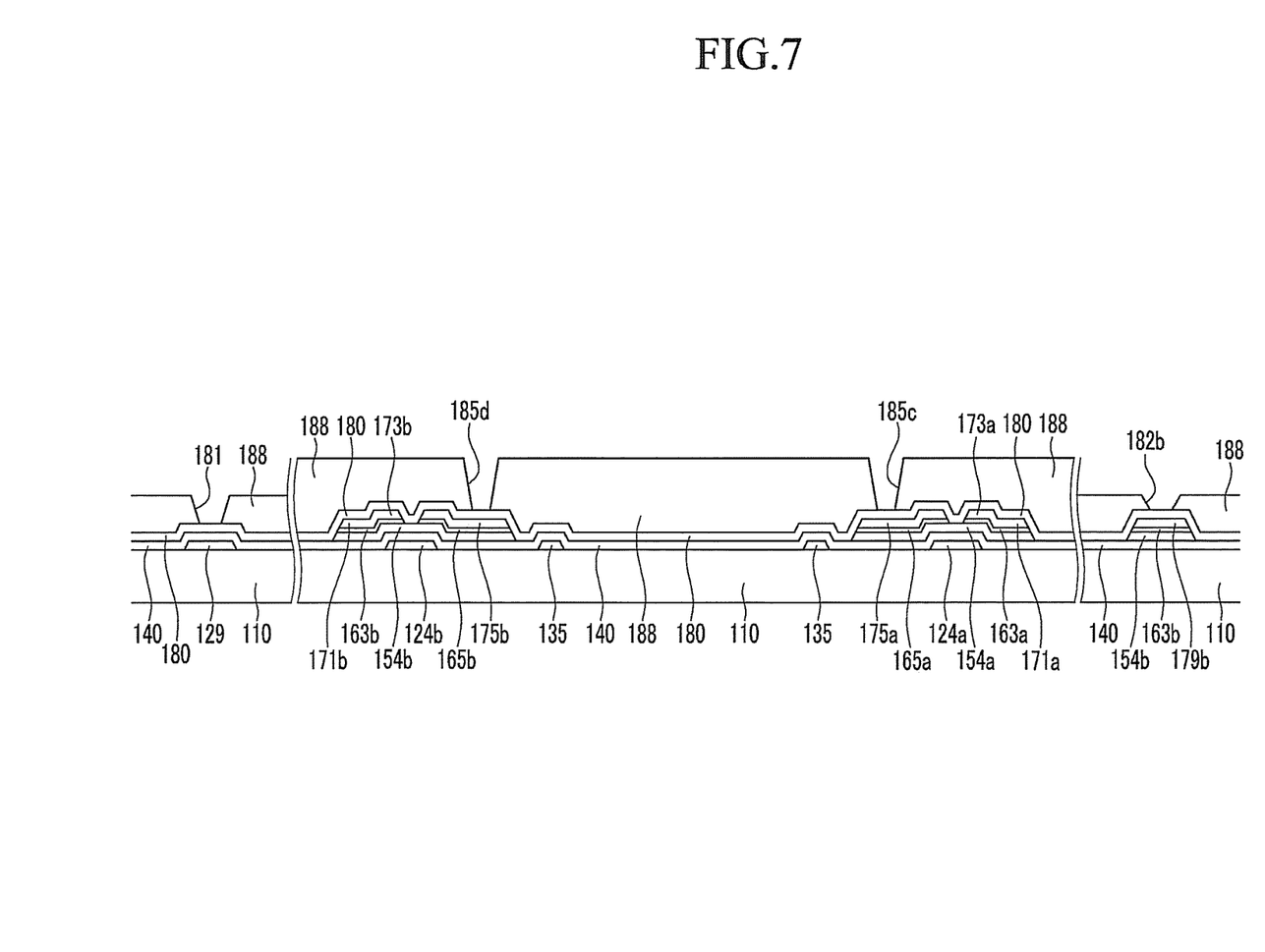

As shown in FIG. 7, a single heat treatment is applied to the organic layer 188a to planarize the protrusion and depression pattern and form an insulating layer 188. A first thickness of the final insulating layer 188 disposed under and overlapping the first and second contact assistants 81, 82a, and 82b is smaller than a second thickness of the final insulating layer 188 under and overlapping the pixel electrode 191. The first thickness of the insulating layer 188 disposed under the first and second contact assistants 81, 82a, and 82b may be less than about 1.5 μm. That is, the single heat treatment of the organic layer 188a forms both of the first and second thicknesses at substantially a same time (e.g., simultaneously). The heat treatment may be executed at a temperature of about 220 degrees Celsius (° C.) to about 230 degrees Celsius (° C.) for about 30 minutes to about 1 hour.

Figure 8:
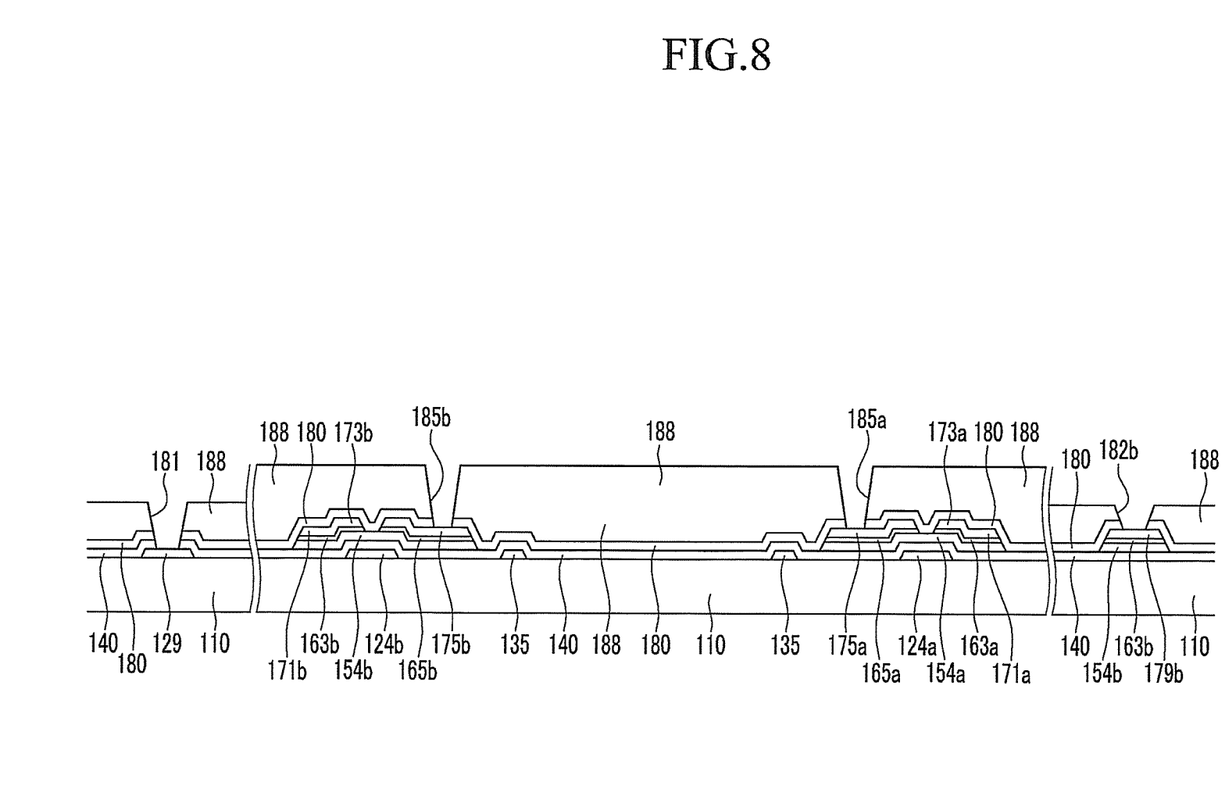

As shown in FIG. 8, the passivation layer 180 and the gate insulating layer 140 are etched by using the insulating layer 188 as a mask to finally form contact holes 181, 182a, 182b, 185a, and 185b.

Referring to FIG. 3, the first contact assistant 81 physically and electrically connected to the gate pad 129, the second contact assistants 82a and 82b physically and electrically connected to the data pads 179a and 179b, and the first and second sub-pixel electrodes 191a and 191b physically and electrically connected to the first and second drain electrode 175a and 175b through the contact holes 181, 182a, 182b, 185a, and 185b, are formed on the insulating layer 188.

Referring again to FIG. 3, an upper panel 200 including a light blocking member 220, a color filter 230, and a common electrode 270 disposed on an insulation substrate 210 is formed, a liquid crystal is dripped on one of the lower panel 100 and the upper panel 200, and the two display panels 100 and 200 are assembled.

A liquid crystal display including the insulating layer 800 with first and second thicknesses is manufactured by forming a protrusion and depression pattern in a negative photosensitive organic layer and heat treating the negative photosensitive organic layer. The insulating layer 800 with the first and second thicknesses of a final liquid crystal display is considered a structural characteristic of the final liquid crystal display. Since the first and second thicknesses are imparted by the forming a protrusion and depression pattern in a negative photosensitive organic layer and heat treating the negative photosensitive organic layer, such processes are considered to impart the distinct structural characteristic of the insulating layer 800 with the first and second thicknesses.

According to the exemplary embodiment of the invention, the thickness of the insulating layer of the contact portion of signal lines what are connected to an external driving circuit is decreased, such that the step of the contact portion may be minimized, thereby improving the contact reliability between the signal line and the external driving circuit, respectively.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a thin film transistor array panel, the method comprising:
    forming a gate electrode, a gate pad, and a gate line on a substrate;
    forming a gate insulating layer on the gate line;
    forming a data line, including a source electrode, a data pad, and a drain electrode facing the source electrode, on the gate insulating layer;
    forming a passivation layer on the gate insulating layer, the data line, and the drain electrode;
    forming a negative photosensitive organic layer on the passivation layer;
    forming a protrusion and depression pattern, and a plurality of openings in the negative photosensitive organic layer, by using a photomask exposed to a light, the protrusion and depression pattern overlapping the gate pad and the data pad;
    heat treating the negative photosensitive organic layer to form an insulating layer including a first portion of a first thickness, and a second portion of a second thickness which is smaller than the first thickness;
    etching the passivation layer and the gate insulating layer by using the insulating layer as a mask, to form a first contact hole exposing the drain electrode, a second contact hole exposing the gate pad, and a third contact hole exposing the data pad; and
    forming a pixel electrode, a first contact assistant, and a second contact assistant on the insulating layer,
    wherein
    the pixel electrode overlaps the first portion of the insulating layer,
    the first and second contact assistants overlap the second portion of the insulating layer, and
    the second thickness of the second portion is less than about 1.5 micrometers.

2. The method of claim 1, wherein
the second portion of the insulating layer is formed by heat treating the protrusion and depression pattern of the negative photosensitive organic layer.

3. The method of claim 2, wherein
the photomask includes a light blocking portion blocking the light, and a transmission portion through which the light is transmitted, and
the light blocking portion of the photomask is disposed overlapping the first contact hole, the second contact hole, the third contact hole, the first contact assistants, and the second contact assistants.

4. The method of claim 3, wherein
the light blocking portion of the photomask includes a first portion overlapping the first contact assistants and the second contact assistants, and
the first portion of the light blocking portion includes a narrow interval including no light blocking material disposed between adjacent portions of the light blocking material.

5. The method of claim 4, wherein
the heat treatment is executed at a temperature of about 220 degrees Celsius to about 230 degrees Celsius, for about 30 minutes to about 1 hour.

6. The method of claim 5, wherein
a thickness of the protrusion and depression pattern in the negative photosensitive organic layer is less than about 0.2 micrometer.

7. The method of claim 6, wherein
the substrate includes a display area and a peripheral area, and
a gate driving circuit and a data driving circuit may be formed in the peripheral area.

8. The method of claim 7, wherein
there are nine hundred sixty channels in the data driving circuit.

9. The method of claim 1, wherein
the photomask includes a light blocking portion blocking the light, and a transmission portion through which the light is transmitted, and
the light blocking portion of the photomask is disposed overlapping the first contact hole, the second contact hole, the third contact hole, the first contact assistants, and the second contact assistants.

10. The method of claim 9, wherein
the light blocking portion of the photomask includes a first portion overlapping the first contact assistants and the second contact assistants, and
the first portion of the light blocking portion includes a narrow interval including no light blocking material disposed between adjacent portions of the light blocking material.

11. The method of claim 1, wherein
the substrate includes a display area and a peripheral area, and
a gate driving circuit and a data driving circuit are formed in the peripheral area.

12. The method of claim 10, wherein
there are nine hundred sixty channels in the data driving circuit.

* * * * *